United States Patent
Oh et al.

(10) Patent No.: US 9,036,441 B2
(45) Date of Patent: May 19, 2015

(54) ANTI-FUSE CIRCUIT IN WHICH ANTI-FUSE CELL DATA IS MONITORED, AND SEMICONDUCTOR DEVICE INCLUDING THE SAME

(71) Applicant: Samsung Electronics Co., Ltd., Suwon-si, Gyeonggi-do (KR)

(72) Inventors: Jong-Min Oh, Seoul (KR); Ho-Young Song, Hwaseong-si (KR); Seong-Jin Jang, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 39 days.

(21) Appl. No.: 13/793,457

(22) Filed: Mar. 11, 2013

(65) Prior Publication Data

US 2013/0294140 A1     Nov. 7, 2013

(30) Foreign Application Priority Data

May 2, 2012 (KR) .......... 10-2012-0046419

(51) Int. Cl.
| G11C 17/00 | (2006.01) |
| G11C 17/18 | (2006.01) |
| G11C 17/16 | (2006.01) |
| G11C 29/00 | (2006.01) |

(52) U.S. Cl.
CPC ............ *G11C 17/16* (2013.01); *G11C 29/76* (2013.01)

(58) Field of Classification Search
USPC .......... 365/96, 225.7, 200, 201, 189.07, 365/189.05, 104
See application file for complete search history.

(56) References Cited

U.S. PATENT DOCUMENTS

| | | | |
|---|---|---|---|
| 5,257,229 A * | 10/1993 | McClure et al. ............ 365/200 |
| 5,514,980 A | 5/1996 | Pilling et al. |
| 5,838,625 A | 11/1998 | Cutter et al. |
| 5,841,787 A | 11/1998 | Warring et al. |
| 6,185,705 B1 * | 2/2001 | Cutter et al. ............ 714/721 |
| 6,239,612 B1 | 5/2001 | Shiflet |
| 6,859,408 B2 * | 2/2005 | Porter et al. ............ 365/225.7 |
| 7,333,383 B2 * | 2/2008 | Vogelsang ............ 365/225.7 |
| 7,339,843 B2 * | 3/2008 | Min et al. ............ 365/200 |
| 7,411,852 B2 * | 8/2008 | Nishioka et al. ............ 365/225.7 |
| 7,826,296 B2 | 11/2010 | Kim et al. |
| 7,830,692 B2 * | 11/2010 | Chung et al. ............ 365/51 |
| 7,859,925 B1 * | 12/2010 | Stansell ............ 365/201 |
| 7,932,738 B1 * | 4/2011 | Banerjee et al. ............ 324/762.01 |
| 2009/0059682 A1 | 3/2009 | Park et al. |
| 2009/0146189 A1 | 6/2009 | Madurawe |
| 2010/0157704 A1 * | 6/2010 | Iwaki ............ 365/200 |

FOREIGN PATENT DOCUMENTS

| KR | 10-20020000460 A | 1/2002 |
| KR | 10-20090070964 A | 7/2009 |

* cited by examiner

*Primary Examiner* — Tha-O H Bui
*Assistant Examiner* — Minh Dinh
(74) *Attorney, Agent, or Firm* — Muir Patent Law

(57) ABSTRACT

An anti-fuse circuit in which anti-fuse program data may be monitored outside of the anti-fuse circuit and a semiconductor device including the anti-fuse circuit are disclosed. The anti-fuse circuit includes an anti-fuse array, a data storage circuit, and a first selecting circuit. The anti-fuse array includes one or more anti-fuse blocks including a first anti-fuse block having a plurality of anti-fuse cells and the anti-fuse array is configured to store anti-fuse program data. The data storage circuit is configured to receive and store the anti-fuse program data from the anti-fuse array through one or more data buses. The first selecting circuit is configured to output anti-fuse program data of a selected anti-fuse block of the one or more anti-fuse blocks in response to a first selection signal.

18 Claims, 10 Drawing Sheets

ANTI-FUSE CIRCUIT IN WHICH ANTI-FUSE CELL DATA IS MONITORED, AND SEMICONDUCTOR DEVICE INCLUDING THE SAME

CROSS-REFERENCE TO RELATED APPLICATION

This application claims priority under 35 U.S.C. §119 to Korean Patent Application No. 10-2012-0046419 filed on May 2, 2012 the entire contents of which are incorporated herein by reference in their entirety.

BACKGROUND

Various example embodiments relate to a semiconductor device, and particularly, to an anti-fuse circuit in which anti-fuse cell data can be monitored, and a semiconductor device including the anti-fuse circuit.

A fuse or an anti-fuse may be used for a semiconductor device, particularly, a semiconductor memory device. A fuse may be a device that is turned off when desired conditions are satisfied, while an anti-fuse may be a device that is turned on when desired conditions are satisfied. The fuse or anti-fuse may be used to select an operation mode of a semiconductor device, or enable a redundancy array when a defective cell is included in a memory cell array.

SUMMARY

According to one embodiment, there is provided an anti-fuse circuit. The anti-fuse circuit includes an anti-fuse array, a data storage circuit, and a first selecting circuit. The anti-fuse array includes one or more anti-fuse blocks including a first anti-fuse block having a plurality of anti-fuse cells and the anti-fuse array is configured to store anti-fuse program data. The data storage circuit is configured to receive and store the anti-fuse program data from the anti-fuse array through one or more data buses. The first selecting circuit is configured to output anti-fuse program data of a selected anti-fuse block of the one or more anti-fuse blocks in response to a first selection signal.

In accordance with another embodiment, a semiconductor memory device includes a memory cell array, an anti-fuse array, a selecting circuit, a column decoder, and a spare column decoder.

The memory cell array has a normal memory cell array connected to word lines and column selecting lines and a spare memory cell array connected to spare word lines and spare column selecting lines. The anti-fuse array includes one or more anti-fuse blocks each having a plurality of anti-fuse cells and the anti-fuse array is configured to store anti-fuse program data. The selecting circuit is configured to select anti-fuse program data of an anti-fuse block of the one or more anti-fuse blocks, and to output the selected anti-fuse program data at an output pad of the semiconductor memory device in response to a first selection signal generated based on a test mode command, when the anti-fuse program data is read from each of anti-fuse blocks through data buses. The column decoder is configured to decode column address signals to generate column selection signals and to provides the column selection signals to the column selecting lines. The spare column decoder is configured to decode the column address signals to generate spare column selection signals based on the anti-fuse program data, and to provide the spare column selection signals to the spare column selecting lines when a defect is generated in at least one column selecting line of the column selecting lines.

In an embodiment, the semiconductor memory device may be a stacked memory device in which a plurality of chips communicate data and control signals by a through-silicon-via (TSV).

In accordance with still another embodiment, a memory system includes a memory controller that generates an address signal and a command signal, and a semiconductor memory device that stores received data or outputs data stored in the semiconductor memory device based on the address signal and the command signal. The semiconductor memory device includes an anti-fuse circuit that selects one of anti-fuse program data to output the selected anti-fuse program data to an exterior through an output pad in response to a first selection signal generated based on a test mode command when the anti-fuse program data is read from each of anti-fuse blocks through data buses.

In accordance with yet another embodiment, a semiconductor device includes an anti-fuse circuit and an internal circuit. The anti-fuse circuit selects one of anti-fuse program data to output the selected anti-fuse program data to an exterior through an output pad in response to a first selection signal generated based on a test mode command, when the anti-fuse program data is read from each of anti-fuse blocks through data buses. The internal circuit performs a specified operation in response to an output signal of the anti-fuse circuit.

In the anti-fuse circuit according to one embodiment, the anti-fuse program data may be monitored outside of the anti-fuse circuit while the anti-fuse program data is sensed. Therefore, the anti-fuse circuit may prevent a semiconductor device from malfunctioning due to the error of the anti-fuse program data.

In accordance with still another embodiment, there is a method of reading anti-fuse program data of a semiconductor device. The method includes transmitting anti-fuse program data from one or more anti-fuse blocks of the anti-fuse array to a data storage circuit through one or more data buses, storing the anti-fuse program data into the data storage circuit, selecting anti-fuse program data of one of the anti-fuse blocks, and outputting the selected anti-fuse program data at an output pad in response to a selecting signal. The outputting the selected anti-fuse program data at the output pad occurs while the selected anti-fuse program data is being transmitted to the data storage circuit.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
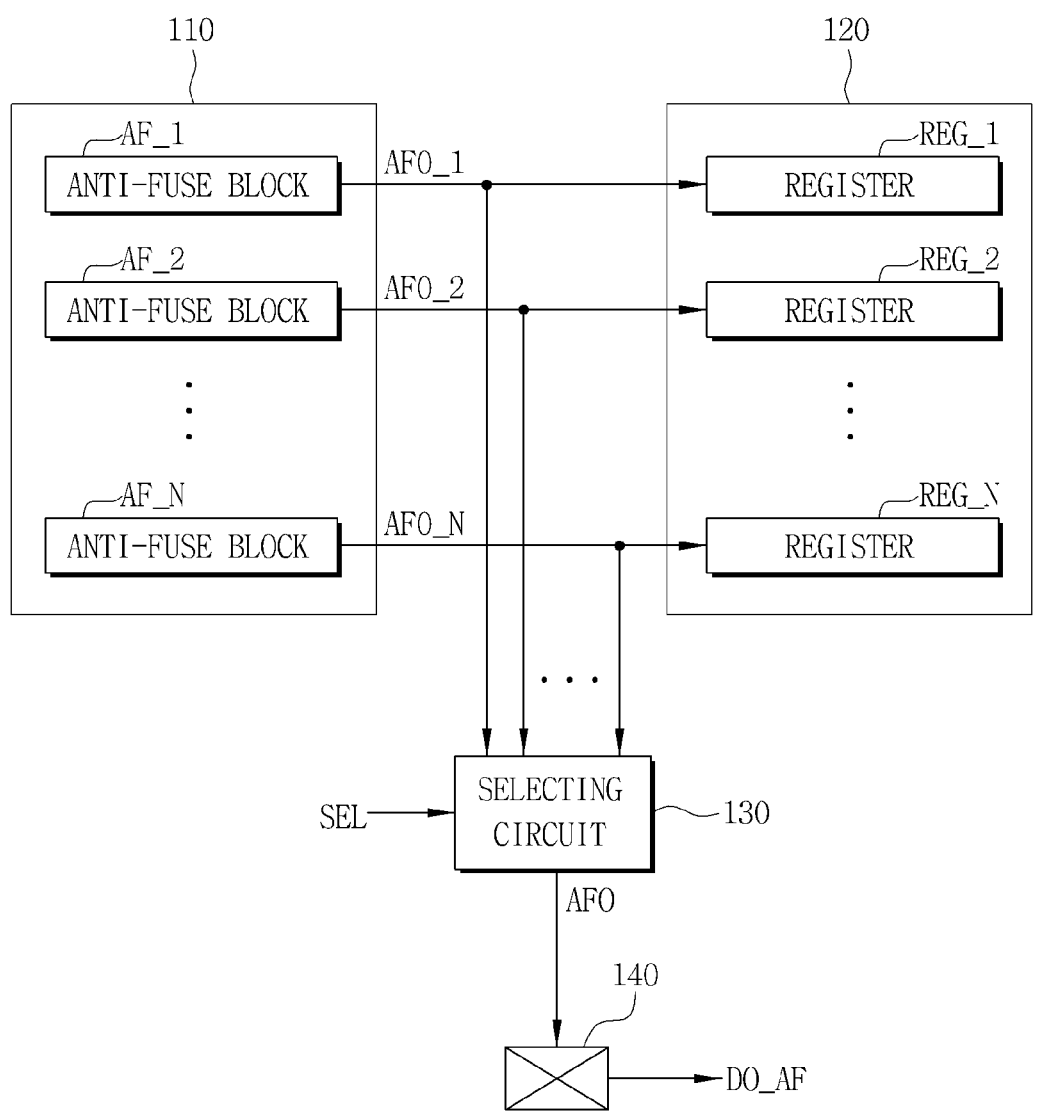
FIG. 1 is a circuit diagram of an anti-fuse circuit capable of monitoring anti-fuse cell data, in accordance with one embodiment.

Example embodiments of the present disclosure are described below in sufficient detail to enable those of ordinary skill in the art to embody and practice the present disclosure. It is important to understand that the present disclosure may be embodied in many alternate forms and should not be construed as limited to the example embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the disclosure, such elements should not be construed as limited by these terms. For example, a first element could be termed a second element, and a second element could be termed a first element, without departing from the scope of the present disclosure. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the disclosure is not intended to limit the scope of the disclosure. The articles "a," "an," and "the" are singular in that they have a single referent, however the use of the singular form in the present document should not preclude the presence of more than one referent. In other words, elements of the disclosure referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein are to be interpreted as is customary in the art to which this disclosure belongs. It will be further understood that terms in common usage should also be interpreted as is customary in the relevant art and not in an idealized or overly formal sense unless expressly so defined herein.

FIG. 1 is a circuit diagram of an anti-fuse circuit 100 capable of monitoring anti-fuse cell data, in accordance with one embodiment.

Referring to FIG. 1, the anti-fuse circuit 100 may include an anti-fuse array 110 including anti-fuse blocks AF_1 to AF_N, a data storage circuit 120 and a first selecting circuit 130.

The anti-fuse array may include anti-fuse blocks AF_1 to AF_N. For example, in one embodiment, the anti-fuse block AF_1 may store data related to test mode information (for example, operating frequency and/or a direct current (DC) voltage level etc.). The anti-fuse block AF_2 may store data related to defective row address information and the anti-fuse block AF_3 may store data related to defective column address information.

The data storage circuit 120 receives and stores anti-fuse program data from each of the anti-fuse blocks AF_1 to AF_N through data buses AFO_1 to AFO_N. The first selecting circuit 130 receives the anti-fuse program data from each of the anti-fuse blocks AF_1 to AF_N through the data buses AFO_1 to AFO_N, and selects one of anti-fuse program data in response to a first selection signal SEL to output the selected anti-fuse program data AFO. For example, the first selection signal SEL may be generated based on a test mode command applied from a controller (not shown). In one embodiment, the data storage circuit 120 receives and stores anti-fuse program data when a power-up control signal is applied to the anti-fuse circuit. For example, the power-up control signal may be generated when a power supply voltage is applied to an anti-fuse circuit or a semiconductor memory device including the anti-fuse circuit.

The first selecting circuit 130 may output the selected anti-fuse program data through an output pad 140. The output pad 140 outputs the output signal AFO of the first selecting circuit 130 as anti-fuse output data DO_AF.

In one embodiment, the anti-fuse program data may be monitored outside of the anti-fuse circuit 100 while the anti-fuse program data is being transmitted to the data storage circuit 120. In another embodiment, the anti-fuse program data may be monitored outside of the anti-fuse circuit 100 after the anti-fuse program data has been transmitted to the data storage circuit 120. The first selection signal SEL may be generated based on a test mode command. For example, the test mode command may be applied from a memory controller (not shown). The anti-fuse circuit 100 may select an anti-fuse block to be tested and sequentially output data of anti-fuse cells included in the selected anti-fuse block once a test mode command is applied. For example, each of the anti-fuse blocks may be selected by a second selection circuit (not shown).

The anti-fuse circuit 100 may be used for repairing defective cells of a semiconductor memory device. In one embodiment, the test mode command may be applied to the anti-fuse circuit 100 when the data of anti-fuse cells included in an anti-fuse block to be tested is transmitted to the data storage circuit 120. For example, the command may be applied while some of the data to be tested is transmitted (i.e., at the same time as, or simultaneously or concurrently with transmission), and/or after all of the data has been transmitted.

Figure 2:
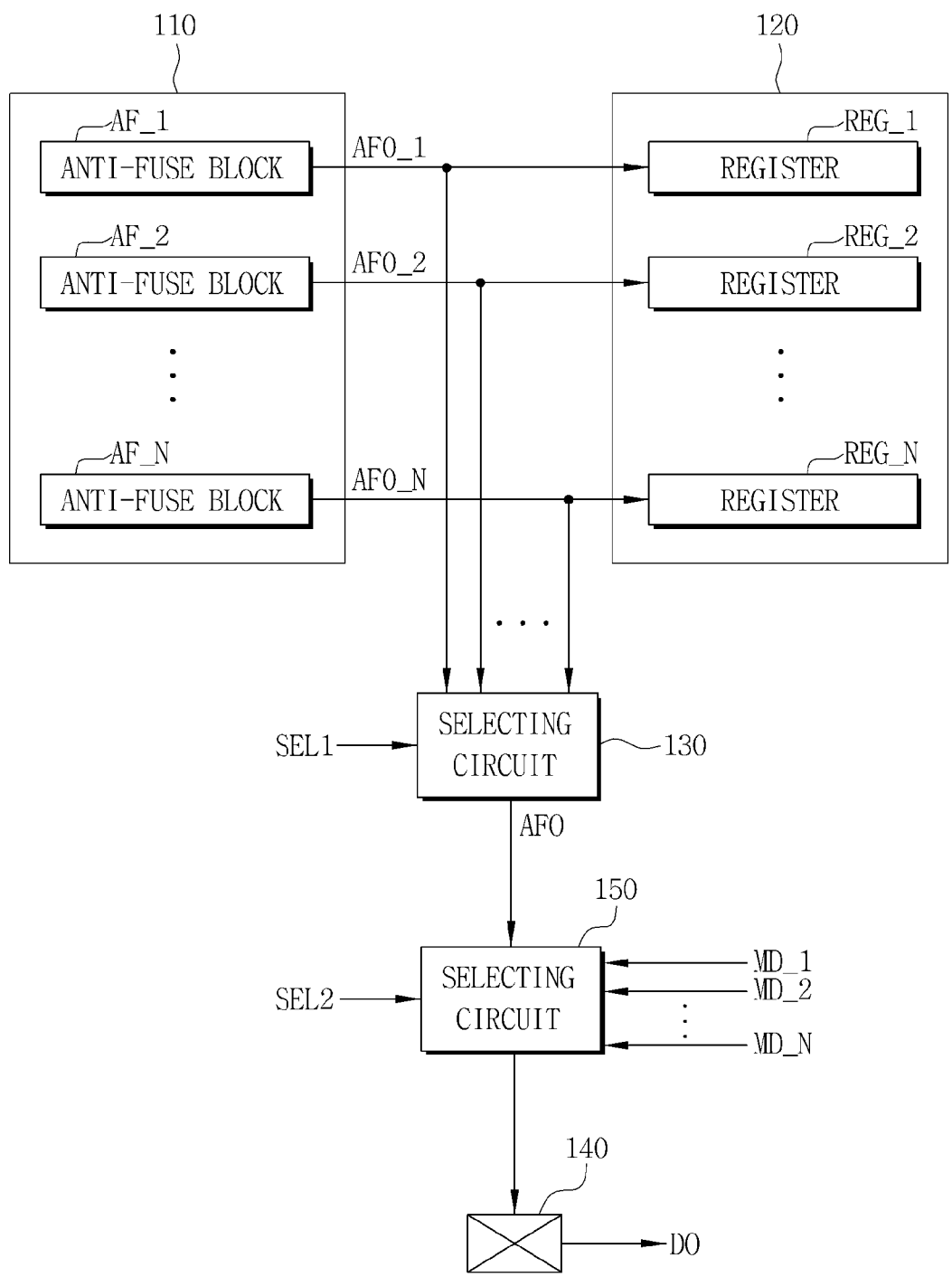
FIG. 2 is a circuit diagram of an anti-fuse circuit capable of monitoring anti-fuse cell data, in accordance with another embodiment.

FIG. 2 is a circuit diagram of an anti-fuse circuit 200 capable of monitoring anti-fuse cell data, in accordance with another embodiment.

Referring to FIG. 2, the anti-fuse circuit 200 may include an anti-fuse array 110 including anti-fuse blocks AF_1 to AF_N, a data storage circuit 120, a first selecting circuit 130, and a second selecting circuit 150.

The anti-fuse array 110, the data storage circuit 120 and a first selecting circuit 130 except the second selecting circuit 150 may be the same as that illustrated in FIG. 1, and description thereof is thus omitted. The second selecting circuit 150 may select one of characteristics test data and the output signal AFO of the first selecting circuit 130 in response to a second selection signal SEL2.

The output signal of the second selecting circuit 130 may be output to an exterior through an output pad 140. The output pad 140 outputs an output signal of the second selecting circuit 150 as output data DO of a semiconductor device. The characteristics test data MD_1 to MD_N may include characteristic test data of a charge sharing margin.

Figure 3:
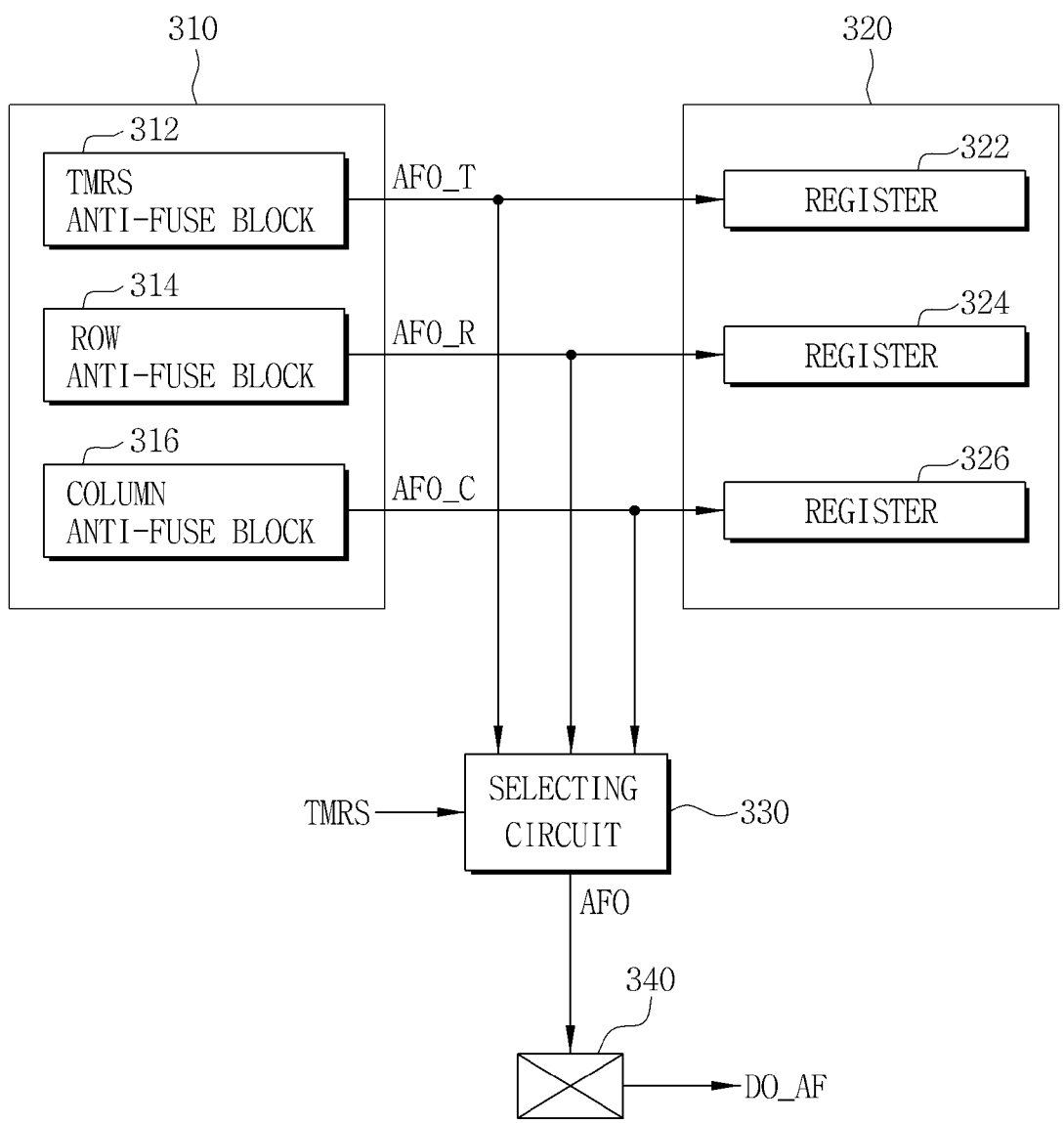
FIG. 3 is a circuit diagram of an anti-fuse circuit capable of monitoring anti-fuse cell data, in accordance with still another embodiment.

FIG. 3 is a circuit diagram of an anti-fuse circuit 300 capable of monitoring anti-fuse cell data, in accordance with still another embodiment.

Referring to FIG. 3, the anti-fuse circuit 300 may include an anti-fuse array 310 including anti-fuse blocks 312, 314 and 316, a data storage circuit 320, and a first selecting circuit 330.

The data storage circuit 320 receives and stores anti-fuse program data from each of the anti-fuse blocks 312, 314 and 316 through data buses AFO_T, AFO_R and AFO_C. The first selecting circuit 330 receives the anti-fuse program data from each of the anti-fuse blocks 312, 314 and 316 through the data buses AFO_T, AFO_R and AFO_C, and selects one of anti-fuse program data in response to a test-mode register set signal TMRS to output the selected anti-fuse program data AFO. For example, the test-mode register set signal TMRS may be generated from a control circuit in a semiconductor memory device or a memory controller (not shown).

In one embodiment, the anti-fuse block 312 may store data related to test mode information (e.g., operating frequency and/or a direct current (DC) voltage level etc.). The anti-fuse block 314 may store data related to defective row address information and the anti-fuse block 316 may store data related to defective column address information.

The first selecting circuit 330 may output the selected anti-fuse program data through an output pad 340. The output pad 340 outputs the output signal AFO of the first selecting circuit 330 as anti-fuse output data DO_AF.

Figure 4:
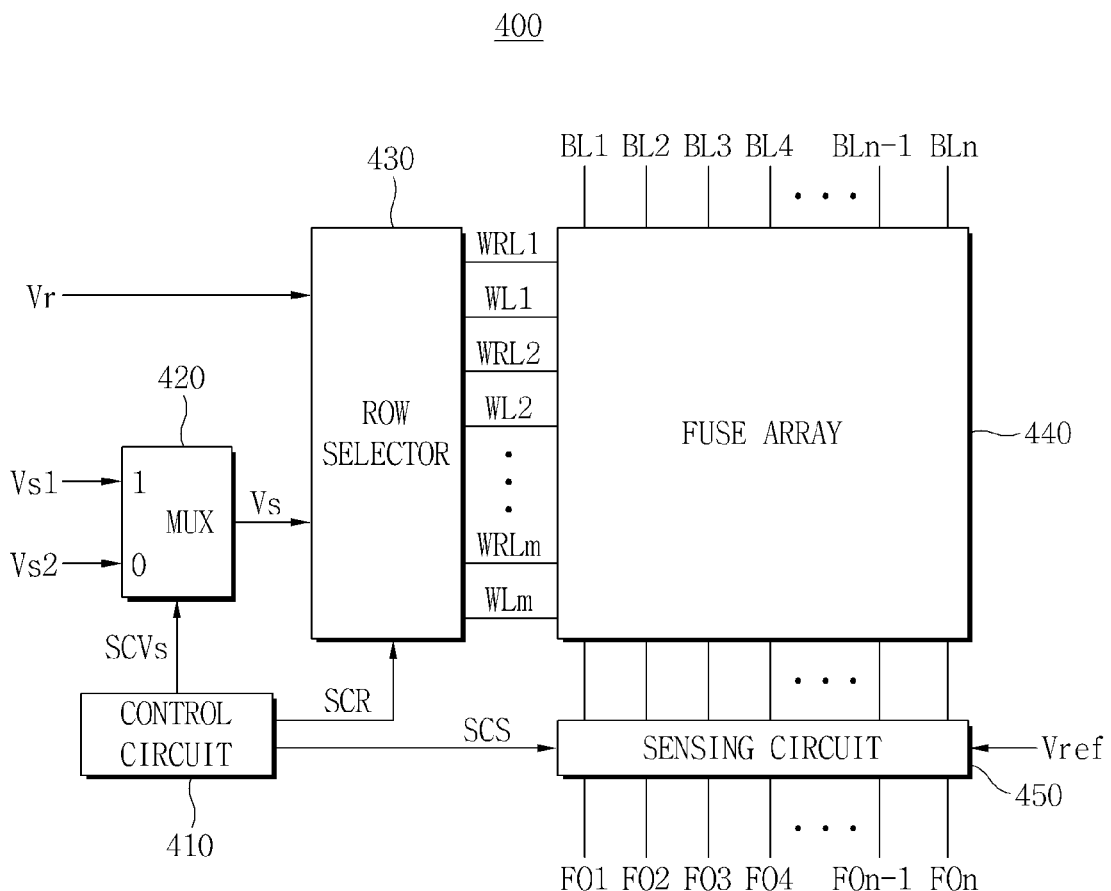
FIG. 4 is a block diagram of an example of an anti-fuse data reading circuit that reads data of an anti-fuse array included in an anti-fuse circuit in accordance with embodiments.

FIG. 4 is a block diagram of an example of an anti-fuse data reading circuit 400 that reads data of an anti-fuse array included in an anti-fuse circuit in accordance with certain embodiments. In FIG. 4, monitoring paths included in the anti-fuse circuits of FIGS. 1 to 3 are not drawn, for convenience of explanation.

Referring to FIG. 4, the anti-fuse data reading circuit 400 may include a multiplexer 420 that selectively outputs a first sensing voltage Vs1 and a second sensing voltage Vs2, a row selector 430 that applies a read voltage Vr and a sensing voltage Vs output from the multiplexer 420 to a selected row of an anti-fuse cell array 440 in which a plurality of fuse cells are arranged, a sensing circuit 450 that senses fuse data stored in fuse cells, and a control circuit 410 that controls the multiplexer 420, the row selector 430 and the sensing circuit 450.

The control circuit 410 outputs a sensing voltage selecting control signal SCVs to the multiplexer 420, outputs a row selecting control signal SCR to apply a read voltage Vr and a sensing voltage Vs output from the multiplexer 420 to a selected row of the anti-fuse cell array 440, and a sensing control signal SCS that controls a sensing of the data stored in fuse cells.

The multiplexer 420 receives a first sensing voltage Vs1 and a second sensing voltage Vs2, selects one of the first sensing voltage Vs1 and the second sensing voltage Vs2 to generate the sensing voltage Vs, and outputs the sensing voltage Vs to the row selector 430.

For example, when the sensing voltage selecting control signal SCVs is in a logic high state, the multiplexer 420 outputs the first sensing voltage Vs1, and when the sensing voltage selecting control signal SCVs is in a logic low state, the multiplexer 420 outputs the second sensing voltage Vs2.

In one embodiment, the first sensing voltage Vs1 may have a higher voltage level than the second sensing voltage Vs2. In one embodiment, the first sensing voltage Vs1 may be applied to the anti-fuse cell array 440 during a first operation period right after a fuse data read operation activates, and the second sensing voltage Vs2 may be applied to the anti-fuse cell array 440 during a second operation period in which direct current (DC) circuits in a semiconductor memory device output stable output voltages.

During the first operation period, sensitivity of a sense amplifier circuit of the sensing circuit 450 may be increased by applying the first sensing voltage Vs1 having a higher voltage level than the second sensing voltage Vs2 to word reading lines WRL1 to WRLm. Therefore, reading errors of fuse data that may be generated because of low sensitivity in the first operation period may be prevented.

The row selector 430 may apply the sensing voltage Vs output from the multiplexer 420 to a word reading line WRL of a selected row of the anti-fuse cell array 440, and may apply the read voltage Vr to a word line WL of the selected row of the anti-fuse cell array 440, in response to the row selecting control signal SCR.

For example, the row selector 430 may include a plurality of switches corresponding to each row. When the row selecting control signal SCR is applied to a switch corresponding to a second row, the row selector 430 may apply the sensing voltage Vs output from the multiplexer 420 to a word reading line WRL2 that connected to the second row, and apply the read voltage Vr to a word line WL2 that connected to the second row.

The anti-fuse cell array 440 may have a plurality of fuse cells arranged in m rows by n columns.

Figure 5:
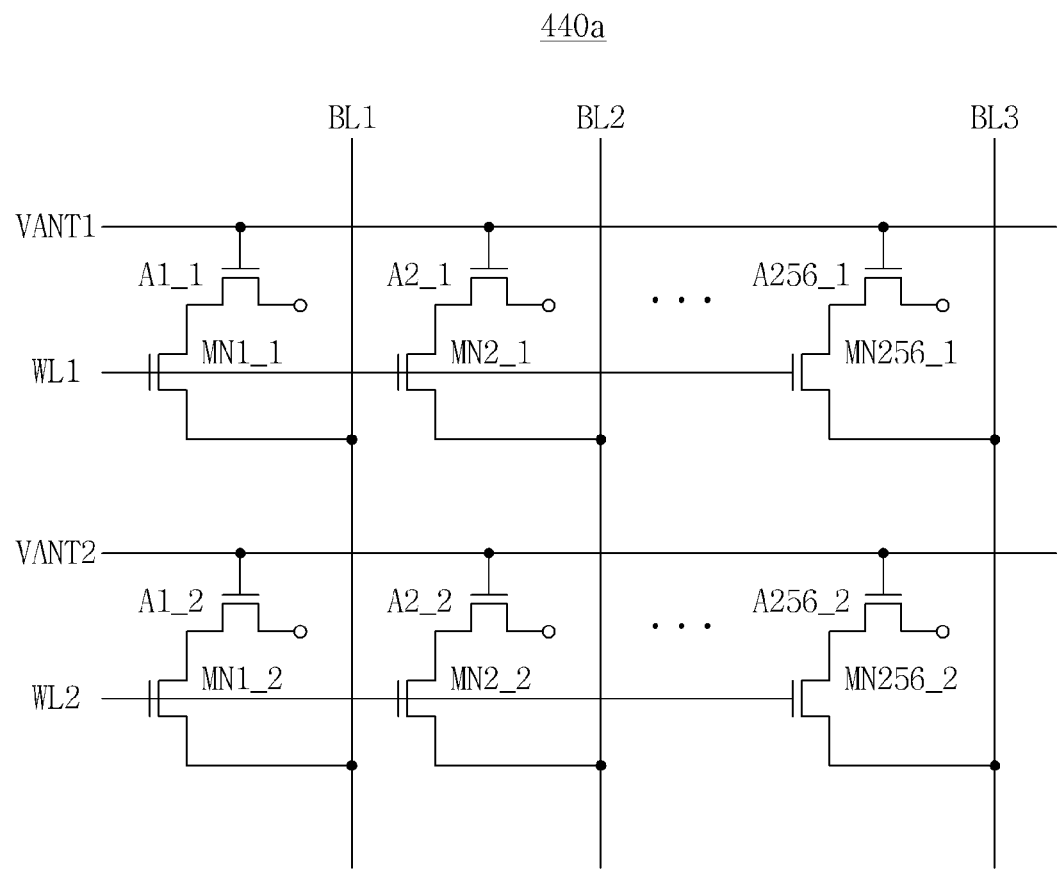
FIG. 5 is a circuit diagram illustrating an anti-fuse cell array included in FIG. 4, in accordance with one embodiment.

FIG. 5 is a circuit diagram illustrating an anti-fuse cell array included in FIG. 4, in accordance with one embodiment.

Referring to FIG. 5, an anti-fuse cell array 440a may include anti-fuse cells A1_1 to A256_1 and selection transistors MN1_1 to MN256_1 connected in series to the anti-fuse cells A1_1 to A256_1, respectively. Also, the anti-fuse cell array 440a may include anti-fuse cells A1_2 to A256_2 and selection transistors MN1_2 to MN256_2 connected in series to the anti-fuse cells A1_2 to A256_2, respectively.

An anti-fusing voltage VANT1 corresponding to the word reading line WRL1 of FIG. 4 may be applied to gates of the respective anti-fuse cells A1_1 to A256_1, and sources of the respective anti-fuse cells A1_1 to A256_1 may be floated. The selection transistors MN1_1 to MN256_1 may have drains, which are respectively electrically connected to drains of the anti-fuse cells A1_1 to A256_1, and gates to which a word line drive signal WL1 corresponding to the word line WL1 of FIG. 4 is applied. Sources of the selection transistors MN1_1 to MN256_1 may be electrically connected to bit lines BL1 to BL3, respectively.

An anti-fuse voltage VANT2 corresponding to the word reading line WRL2 of FIG. 4 may be applied to gates of the respective anti-fuse cells A1_2 to A256_2, and sources of the respective anti-fuse cells A1_2 to A256_2 may be floated. The selection transistors MN1_2 to MN256_2 may have drains, which are electrically connected to drains of the anti-fuse cells A1_2 to A256_2, respectively, and gates to which a word line drive signal WL2 corresponding to the word line WL2 of FIG. 4 is applied. Sources of the selection transistors MN1_2 to MN256_2 may be electrically connected to the bit lines BL1 to BL3, respectively.

Hereinafter, operation of the anti-fuse cell array 440a of FIG. 5 will be described.

When the anti-fuse A1_1 is programmed, a high voltage of, for example, about 6 V may be applied as an anti-fusing voltage VANT1 to the gates of the anti-fuse cells A1_1 to A256_1. A voltage VANT1/2 of, for example, about 3 V may be applied to the gate of the selection transistor MN1_1 connected to the drain of the anti-fuse A1_1 to turn on the selection transistor MN1_1. A low electric potential of, for example, 0 V may be applied to the bit line BL1 electrically connected to the source of the selection transistor MN1_1. Under this condition, a thin gate oxide layer of the anti-fuse A1_1 may be broken to form an ohmic contact between a gate electrode and the drain. Thus, a current path may lead from a gate electrode of the anti-fuse A1_1 to the bit line BL1. In this case, a voltage VANT1/2 of, for example, about 3 V may be applied to bit lines electrically connected to unselected cells such that a high voltage is not applied to both ends of the gate oxide layer of the anti-fuse A1_1. Also, a low voltage of, for example, 0 V may be applied to gates of the anti-fuse cells A1_2 to A256_2 to be unprogrammed so that unselected anti-fuse cells may not be programmed.

Figure 6:
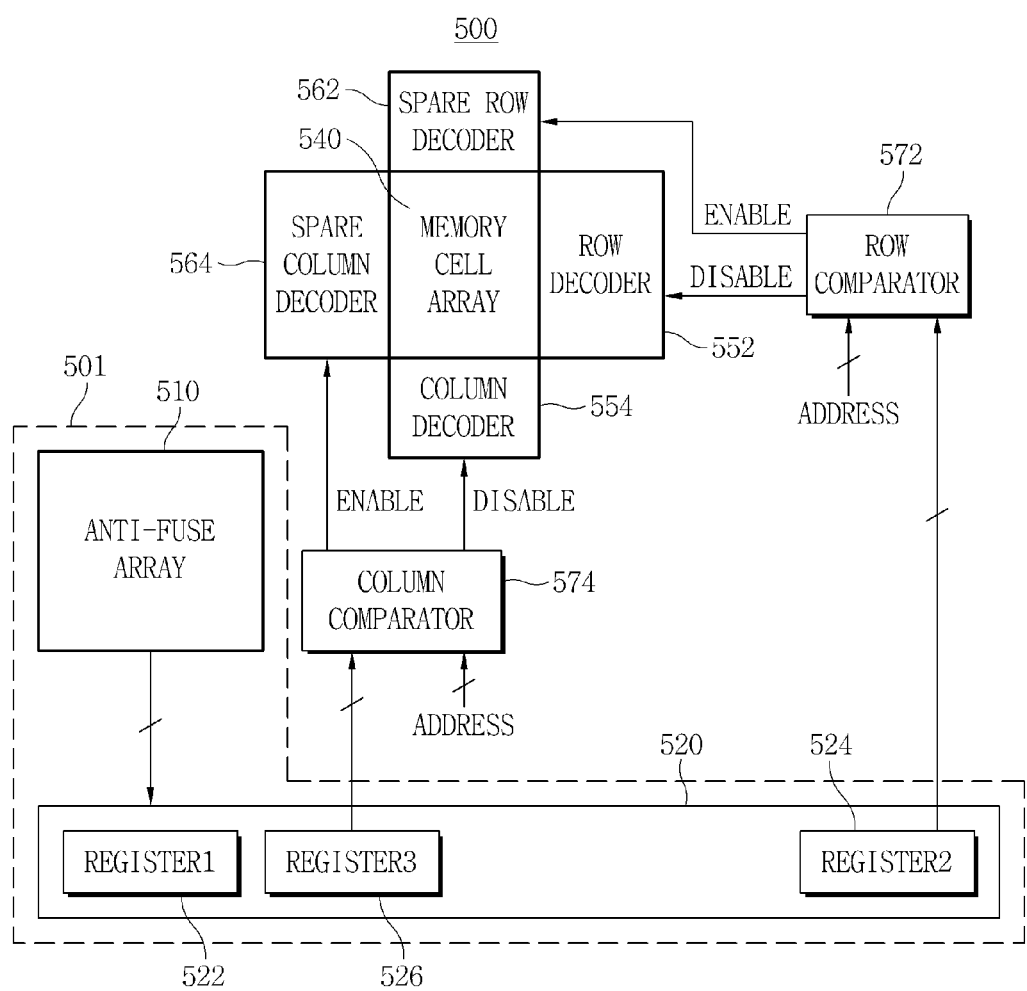
FIG. 6 is a block diagram of an example of a semiconductor memory device including the anti-fuse circuit in accordance with certain embodiments.

FIG. 6 is a block diagram of an example of a semiconductor memory device 500 including the anti-fuse circuit in accordance with certain embodiments.

The semiconductor memory device 500 may be implemented, for example, by a volatile or non-volatile memory device. The volatile memory device may include dynamic random access memory (DRAM), static RAM (SRAM), thyristor RAM (T-RAM), zero capacitor RAM (Z-RAM), or twin transistor RAM (TTRAM). The non-volatile memory device may include, for example, electrically erasable programmable read-only memory (EEPROM), flash memory, magnetic random access memory (MRAM), spin-transfer torque MRAM, conductive bridging RAM (CBRAM), ferroelectric RAM (FeRAM), phase-change RAM (PRAM), resistive RAM (RRAM), nanotube RRAM, polymer RAM (PoRAM), nano floating gate memory (NFGM), holographic memory, molecular electronic memory device, or insulator resistance change memory.

Referring to FIG. 6, the semiconductor memory device 500 may include an anti-fuse circuit 501. The anti-fuse circuit 501 may be one of the above disclosed embodiments. The anti-fuse circuit 501 may include an anti-fuse array 510 and a data storage circuit 520. The data storage circuit 520 may include a first register circuit 522, a second register circuit 524, and a third register circuit 526. The first through third register circuits 522, 524 and 526 may store anti-fuse program data received from the anti-fuse array 510, respectively. Further, the semiconductor memory device 500 may include a memory cell array 540 that stores data, a row decoder and a column decoder 552 and 554 that drive word lines and bit lines of the memory cell array 540, a spare row decoder and a spare column decoder 562 and 564 that drive spare cells of the memory cell array 540, and a row comparator and a column comparator 572 and 574 that compare address information of a defective cell and external address information.

The second and the third register circuits 524 and 526 may be arranged adjacent to various circuit blocks. For example, the second register circuit 524 that stores the row address information may be arranged adjacent to the row comparator 572. Further, the third register circuit 526 that stores the column address information may be arranged adjacent to the column comparator 574.

The row comparator 572 compares the row address received from the exterior of the semiconductor memory device 500 with the row address information of a defective cell, and drives the row decoder 552 or the spare row decoder 562 according to the comparison results. Similarly, the column comparator 574 compares the column address received from the exterior with the column address information of the defective cell, and drives the column decoder 554 or the spare column decoder 564 according to the comparison results.

The row comparator 572 and the column comparator 574 may include a plurality of logic devices to compare the address information from the exterior and the address information of the defective cell, respectively.

Figure 7:
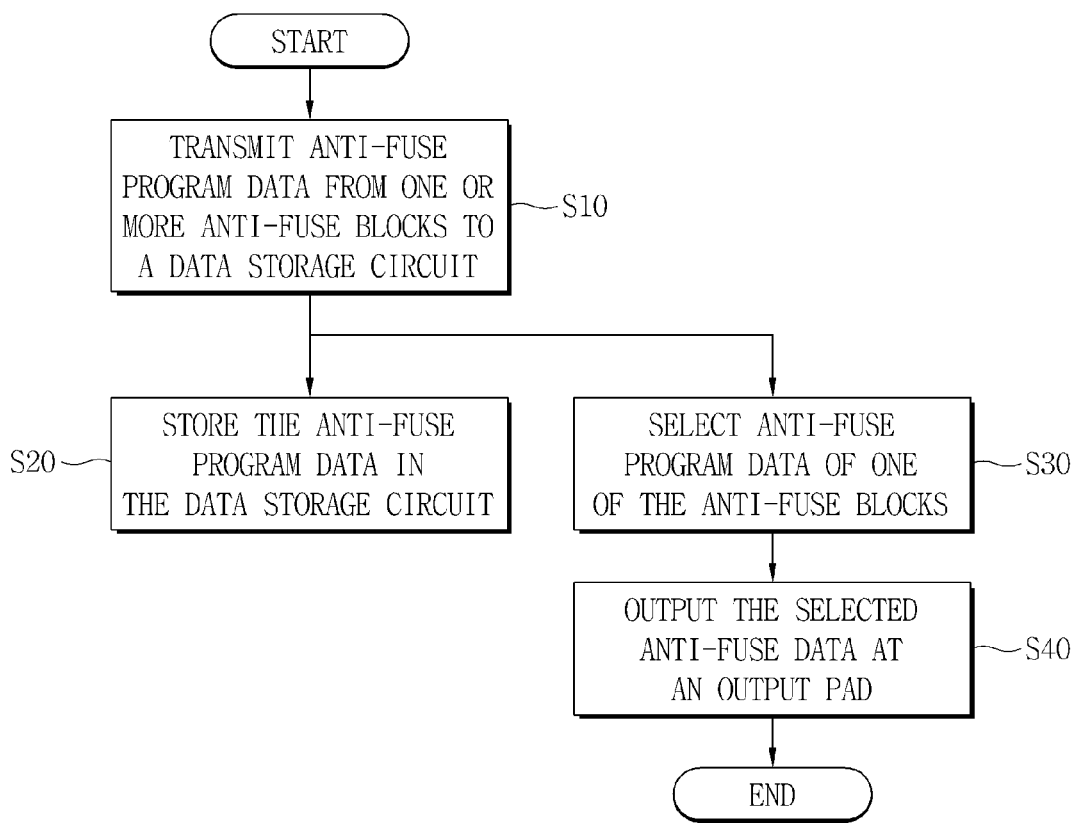
FIG. 7 is an exemplary flowchart illustrating a method of reading anti-fuse program data stored in the anti-fuse circuit in accordance with one embodiment.

FIG. 7 is an exemplary flowchart illustrating a method of reading anti-fuse program data stored in the anti-fuse circuit of a semiconductor memory device in accordance with one embodiment.

Referring to FIGS. 1, 6 and 7, the semiconductor memory device 500 may transmit anti-fuse program data from one or more anti-fuse blocks of the anti-fuse array 110 to the data storage circuit 120 in operation S10. The data storage circuit 120 may store the anti-fuse program data in operation S20 and the semiconductor memory device 500 may select anti-fuse program data of one of the anti-fuse blocks in operation S30. The semiconductor memory device 500 output the selected anti-fuse program data at an output pad in response to a selecting signal in operation S40. Steps S20 and S30 can occur concurrently (e.g., part or all of the steps can occur simultaneously), or can occur one after the other.

Figure 8:
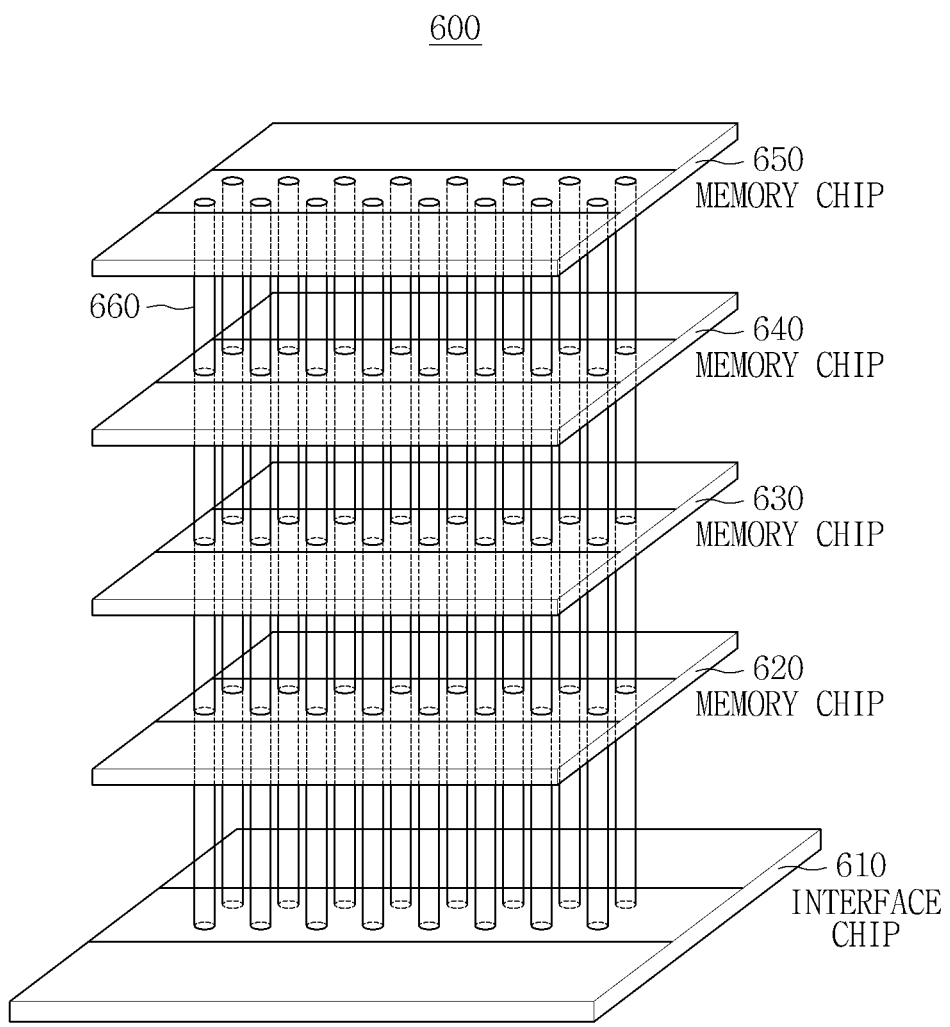
FIG. 8 is a perspective view of an example of a stacked semiconductor device including a semiconductor memory device in accordance with certain embodiments.

FIG. 8 is a perspective view of an example of a stacked semiconductor device 600 including a semiconductor memory device in accordance with certain embodiments.

Referring to FIG. 8, the stacked semiconductor device 600 may include an interface chip 610, and memory chips 620, 630, 640 and 650 which are electrically connected through through-substrate vias 660 (e.g., through-silicon vias). Although the through-substrate vias 660 disposed in two rows are shown in FIG. 8, the stack semiconductor device 600 may include any number of through-substrate vias.

The memory chips 620, 630, 640 and 650 included in the stacked semiconductor device 600 may include an anti-fuse circuit in accordance with the embodiments as described above. The interface chip 610 performs as an interface between the memory chips 620, 630, 640 and 650 and external devices.

Figure 9:
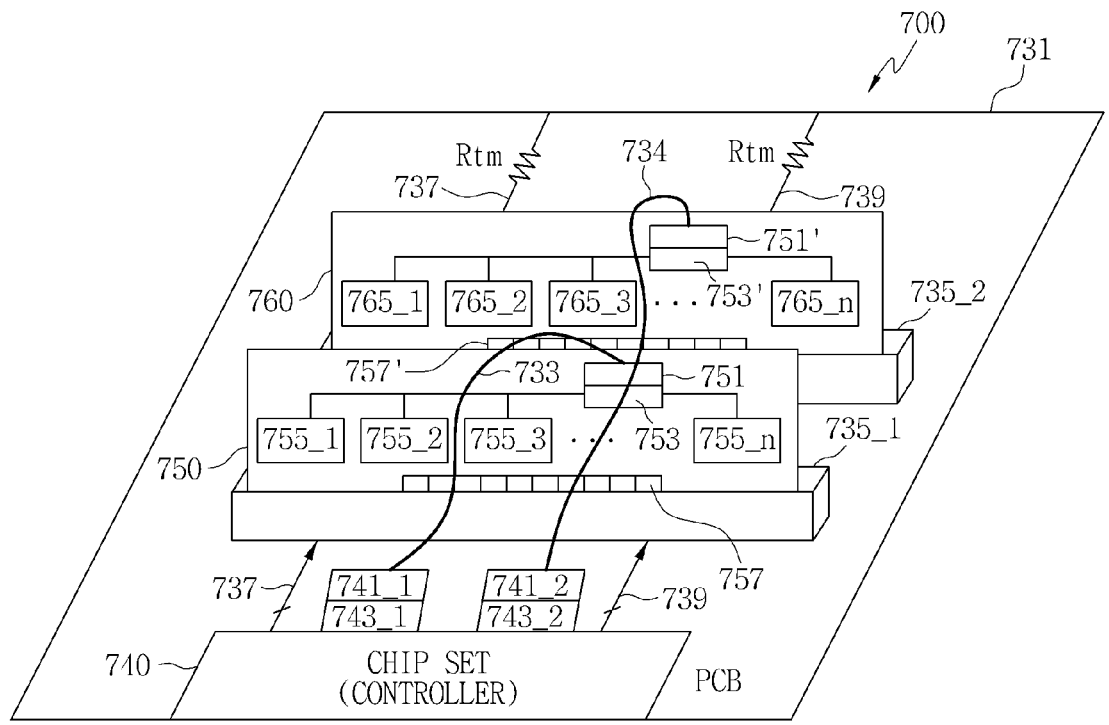
FIG. 9 is a diagram of an example of a memory system including a semiconductor memory device in accordance with certain embodiments.

FIG. 9 is a diagram of an example of a memory system 700 including a semiconductor memory device in accordance with certain embodiments.

Referring to FIG. 9, the memory system 700 may include a motherboard 731, a chip set (or a controller) 740, slots 735_1 and 735_2, memory modules 750 and 760, and transmission lines 733 and 734. Buses 737 and 739 connect the chip set 740 with the slots 735_1 and 735_2. A terminal resistor Rtm may terminate each of the buses 737 and 739 on a PCB of the motherboard 731.

For convenience, in FIG. 9, only two slots 735_1 and 735_2 and two memory modules 750 and 760 are shown. However, the memory system 700 may include an arbitrary number of slots and memory modules.

The chip set 740 may be mounted on the PCB of the motherboard 731, and control the operation of the memory system 700. The chip set 740 may include connectors 741_1 and 741_2 and converters 743_1 and 743_2.

The converter 743_1 receives parallel data generated by the chip set 740, converts the parallel data to serial data, and outputs the serial data to the transmission line 733 via the connector 741_1. The converter 743_1 receives serial data via the transmission line 733, converts the serial data to parallel data, and outputs the parallel data to the chip set 740.

The converter 743_2 receives parallel data generated by the chip set 740, converts the parallel data to serial data, and outputs the serial data to the transmission line 734 via the connector 741_2. The converter 743_2 receives serial data via the transmission line 734, converts the serial data to parallel data, and outputs the parallel data to the chip set 740. The transmission lines 733 and 734 included in the memory system 700 may be a plurality of optical fibers.

The memory module 750 may include a plurality of memory devices 755_1 to 755_n, a first connector 757, a second connector 751, and a converter 753. The memory module 760 may include a plurality of memory devices 765_1 to 765_n, a first connector 757', a second connector 751', and a converter 753'.

The first connector 757 of the memory module 750 may transfer low-speed signals received from the chip set 740 to the memory devices 755_1 to 755_n, and the second connector 751 of the memory module 750 may be connected to the transmission line 733 for transferring high-speed signals.

The converter 753 of the memory module 750 receives serial data via the second connector 751 of the memory module 750, converts the serial data to parallel data, and outputs the parallel data to the memory devices 755_1 to 755_n. Further, the converter 753 receives parallel data from the memory devices 755_1 to 755_n, converts the parallel data to serial data, and outputs the serial data to the second connector 751.

The memory devices 755_1 to 755_n and 765_1 to 765_n may include a semiconductor memory device according to embodiments described above. Therefore, the memory devices 755_1 to 755_n and 765_1 to 765_n may include an anti-fuse circuit according to embodiments disclosed herein. The memory devices 755_1 to 755_n and 765_1 to 765_n may be, for example, a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

Figure 10:
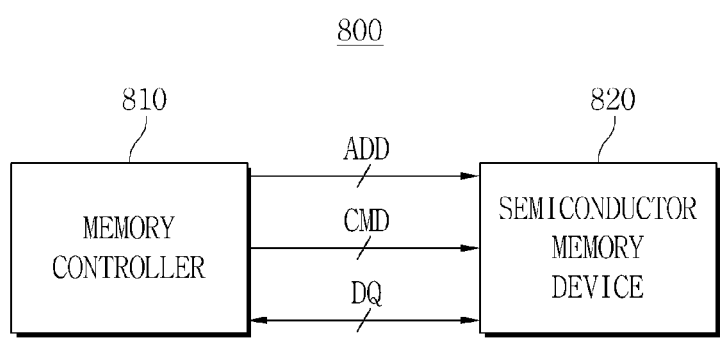
FIG. 10 is a block diagram of another example of a memory system including a semiconductor memory device in accordance with certain embodiments.

FIG. 10 is a block diagram of another example of a memory system 800 including a semiconductor memory device in accordance with certain embodiments.

Referring to FIG. 10, the memory system 800 includes a memory controller 810 and a semiconductor memory device 820.

The memory controller 810 generates address signals ADD and command signals CMD and provides the address signals ADD and the command signals CMD to the semiconductor memory device 820 through buses. Data DQ may be transmitted from the memory controller 810 to the semiconductor memory device 820 through the buses, or transmitted from the stacked semiconductor memory device 820 to the memory controller 810 through the buses.

The semiconductor memory device 820 may include an anti-fuse circuit according to example embodiments disclosed herein.

Figure 11:
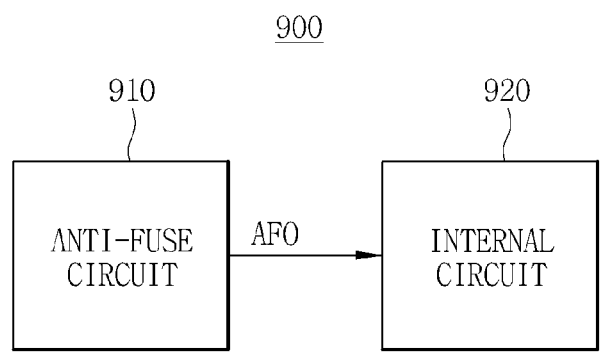
FIG. 11 is a block diagram of another example of a semiconductor memory device including the anti-fuse circuit in accordance with certain embodiments.

FIG. 11 is a block diagram of another example of a semiconductor memory device 900 including the anti-fuse circuit in accordance with certain embodiments.

Referring to FIG. 11, a semiconductor device 900 may include an anti-fuse circuit 910 and an internal circuit 920.

The anti-fuse circuit 910 may perform an anti-fusing operation and generate an anti-fuse output voltage AFO. The internal circuit 920 may perform a specific operation in response to the anti-fuse output voltage AFO. The specific operation may include selecting an operation mode of the semiconductor device 900, or enabling a redundancy array when a defective cell is included in a memory cell array.

Figure 12:
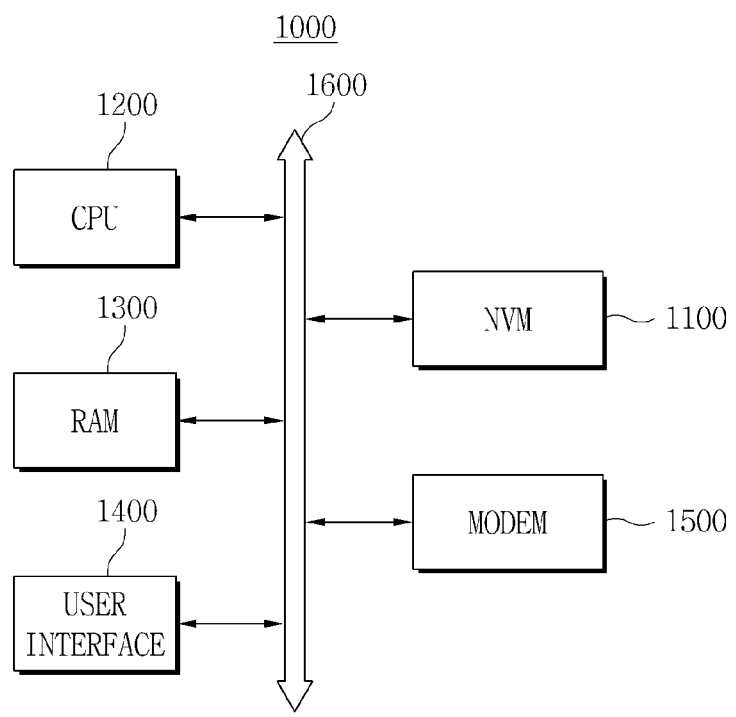
FIG. 12 is a block diagram of an example of an electronic system including a semiconductor memory device in accordance with certain embodiments.

FIG. 12 is a block diagram of an example of an electronic system 1000 including a semiconductor memory device in accordance with certain embodiments.

Referring to FIG. 12, the electronic system 1000 in accordance with embodiments may include a central processing unit (CPU) 1200 electrically connected to a system bus 1600, a random access memory (RAM) 1300, a user interface 1400, a MODEM such as a baseband chipset, and a non-volatile memory device (NVM) 1100.

The NVM 1100 and the RAM 1300 store or output data, and include various logic circuits therein. When the electronic system 1000 according to example embodiments is a mobile device, a battery that supplies operating voltage to the electronic system 1000 may be additionally provided (not shown). Although not drawn in FIG. 11, the electronic system 1000 may be further provided with an application chipset, a camera image processor, and a mobile DRAM, that is obvious to ordinary skill in the art. The NVM 1100 is, for example, may comprise a solid state drive/disk (SSD) including non-volatile memory devices for storing data. Further, the NVM 1100 may comprise a fusion flash memory in which a static random access memory (SRAM), a NAND flash memory and a NOR interface logic are combined.

A semiconductor device according to example embodiments disclosed herein may be applied to a part of the electronic system 1000. For example, when the electronic system 1000 is booting, the example embodiments of the disclosure may be applied to set operating environments. Each of the NVM 1100 and the RAM 1300 may include an anti-fuse circuit in which anti-fuse program data can be monitored outside of the semiconductor device.

The semiconductor device and/or the system according to example embodiments described herein may be mounted using various types of packages. For example, the semiconductor device and/or the system may be mounted using packages such as Package on Package (POP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-Level Processed Stack Package (WSP).

Embodiments of the present disclosure may be applied to a semiconductor device, and particularly, to a semiconductor memory device and a memory system including the semiconductor memory device.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this disclosure as defined in the claims. In the claims, means-plus-function clauses are intended to cover the structures described herein as performing the recited function, and not only structural equivalents but also equivalent structures.

What is claimed is:

1. An anti-fuse circuit, comprising:
    an anti-fuse array including one or more anti-fuse blocks including a first anti-fuse block having a plurality of anti-fuse cells, the anti-fuse array configured to store anti-fuse program data;
    a data storage circuit configured to receive and store the anti-fuse program data from the anti-fuse array through one or more data buses; and
    a first selecting circuit configured to output anti-fuse program data of a selected anti-fuse block of the one or more anti-fuse blocks in response to a first selection signal,
    wherein the anti-fuse program data is configured to be monitored outside of the anti-fuse circuit while the anti-fuse program data is transmitted from the anti-fuse array to the data storage circuit.

2. The anti-fuse circuit according to claim 1, wherein the first selecting circuit is configured to output selected anti-fuse program data of the selected anti-fuse block through an output pad.

3. The anti-fuse circuit according to claim 1, wherein the first selection signal is generated based on a test mode command.

4. The anti-fuse circuit according to claim 3, wherein the anti-fuse circuit is configured to select an anti-fuse block to be tested, and sequentially output data of anti-fuse cells included in the selected anti-fuse block once the test mode command is applied.

5. The anti-fuse circuit according to claim 4, wherein the anti-fuse circuit is configured to be used for repairing defective cells of a semiconductor memory device.

6. The anti-fuse circuit according to claim 5, wherein the anti-fuse circuit is configured to apply the test mode command after all of the data of anti-fuse cells included in the selected anti-fuse block to be tested is transmitted to the data storage circuit.

7. The anti-fuse circuit according to claim 1, wherein the anti-fuse array includes a test-mode anti-fuse block configured to be used to set a test-mode register set signal (TMRS).

8. The anti-fuse circuit according to claim 1, wherein the anti-fuse array includes a row anti-fuse block configured to be used to substitute a defective word line of a memory cell array of a semiconductor memory device with a spare word line.

9. The anti-fuse circuit according to claim 1, wherein the anti-fuse array includes a column anti-fuse block configured to be used to substitute a defective column selecting line of a memory cell array of a semiconductor memory device with a spare column selecting line.

10. The anti-fuse circuit according to claim 1, wherein the data storage circuit includes registers configured to store anti-fuse program data received from the one or more anti-fuse blocks.

11. The anti-fuse circuit according to claim 1, wherein the anti-fuse circuit further comprises:
    a second selecting circuit configured to select one of at least one characteristics test data and the selected anti-fuse program data in response to a second selection signal.

12. The anti-fuse circuit according to claim 11, wherein the characteristics test data includes characteristic test data of a charge sharing margin.

13. A semiconductor memory device, comprising:
    a memory cell array having a normal memory cell array connected to word lines and column selecting lines, and a spare memory cell array connected to spare word lines and spare column selecting lines;
    an anti-fuse array including one or more anti-fuse blocks each having a plurality of anti-fuse cells, the anti-fuse array configured to store anti-fuse program data;
    a selecting circuit configured to select anti-fuse program data of an anti-fuse block of the one or more anti-fuse blocks, and to output the selected anti-fuse program data at an output pad of the semiconductor memory device in response to a first selection signal generated based on a test mode command, when the anti-fuse program data is read from each of anti-fuse blocks through data buses;
    a column decoder configured to decode column address signals to generate column selection signals, and to provide the column selection signals to the column selecting lines; and
    a spare column decoder configured to decode the column address signals to generate spare column selection signals based on the anti-fuse program data, and to provide the spare column selection signals to the spare column selecting lines when a defect is generated in at least one column selecting line of the column selecting lines; and
    a data storage circuit configured to receive and store the anti-fuse program data from the anti-fuse array through one or more data buses,
    wherein the selected anti-fuse program data is output at the output pad while the anti-fuse program data is being transmitted to the data storage circuit.

14. The semiconductor memory device according to claim 13, wherein the semiconductor memory device is a stacked memory device in which a plurality of chips communicate data and control signals by a through-silicon-via (TSV).

15. A method of reading anti-fuse program data of a semiconductor device including an anti-fuse array, the method comprising:

transmitting anti-fuse program data from one or more anti-fuse blocks of the anti-fuse array to a data storage circuit through one or more data buses;

storing the anti-fuse program data into the data storage circuit;

selecting anti-fuse program data of one of the anti-fuse blocks; and outputting the selected anti-fuse program data at an output pad in response to a selecting signal, wherein outputting the selected anti-fuse program data at the output pad occurs while the selected anti-fuse program data is being transmitted to the data storage circuit.

16. The method according to claim 15, wherein transmitting the anti-fuse program data includes selecting one of the anti-fuse blocks.

17. The method according to claim 15, wherein the selecting signal is generated based on a test mode command signal.

18. The method according to claim 15, wherein outputting the selected anti-fuse program data includes sequentially outputting all program data of the selected anti-fuse block.

* * * * *